(12) United States Patent
Bedinger et al.

(10) Patent No.: US 6,958,260 B2
(45) Date of Patent: Oct. 25, 2005

(54) HYDROGEN GETTERING SYSTEM

(75) Inventors: John M. Bedinger, Garland, TX (US); Clyde R. Fuller, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/642,661

(22) Filed: Aug. 19, 2003

(65) Prior Publication Data

US 2004/0036168 A1 Feb. 26, 2004

Related U.S. Application Data

(62) Division of application No. 08/946,212, filed on Oct. 7, 1997, now Pat. No. 6,673,400.

(60) Provisional application No. 60/028,541, filed on Oct. 15, 1996.

(51) Int. Cl.[7] .................. H01L 21/44; H01L 21/48; H01L 21/50; H01L 23/20; H01L 23/26
(52) U.S. Cl. .................. 438/115; 438/116; 257/682; 257/E23.137
(58) Field of Search .............. 438/115, 116; 257/682, 257/E23.137, E23.193; 95/55, 56

(56) References Cited

U.S. PATENT DOCUMENTS

| | | | |
|---|---|---|---|
| 3,896,042 A | 7/1975 | Anderson et al. ............. 252/184 |
| 4,405,487 A | 9/1983 | Harrah et al. ................ 252/194 |
| 4,468,235 A | 8/1984 | Hill ............................... 55/16 |
| 4,528,003 A | 7/1985 | Dittrich et al. ................ 55/158 |
| 4,661,415 A | 4/1987 | Ebato et al. .................. 428/570 |
| 4,755,359 A | 7/1988 | Klatt et al. ................... 422/113 |
| 4,827,188 A | 5/1989 | Hurst ........................... 313/559 |
| 4,886,048 A | 12/1989 | Labaton et al. ........ 165/104.27 |
| 4,997,124 A | 3/1991 | Kitabatake et al. .......... 228/184 |
| 5,149,420 A | 9/1992 | Buxbaum et al. ............ 205/219 |
| 5,324,887 A | 6/1994 | Catt et al. .................. 174/35 R |
| 5,491,361 A * | 2/1996 | Stupian et al. ............... 257/680 |
| 5,543,364 A | 8/1996 | Stupian et al. ............... 437/210 |
| 5,591,379 A | 1/1997 | Shores ........................ 252/194 |
| 5,760,433 A | 6/1998 | Ramer et al. ................ 257/295 |
| 5,888,925 A | 3/1999 | Smith et al. ................. 502/400 |
| 6,423,575 B1 * | 7/2002 | Tran et al. .................... 438/115 |
| 2003/0102540 A1 * | 6/2003 | Lee .............................. 257/676 |
| 2003/0109083 A1 * | 6/2003 | Ahmad ........................ 438/125 |
| 2004/0126953 A1 * | 7/2004 | Cheung ....................... 438/200 |

FOREIGN PATENT DOCUMENTS

JP 59208860 11/1984 ........... H01L 23/26

OTHER PUBLICATIONS

Chem.Abstra.119: 16841 (JP 04313317) "Apparatus for removal of hydrogen from vacuum chambers especially high energy accelerators at ultra-low temperatures" by Saes Getters, S.p.A.
Abstract of JP59208860, Patent Abstracts of Japan. vol. 009, No. 075 (E306), Apr. 4, 1985.

* cited by examiner

*Primary Examiner*—Craig A. Thompson
*Assistant Examiner*—Heather A. Doty
(74) *Attorney, Agent, or Firm*—Frederick J. Telecky, Jr.; W. James Brady, III

(57) ABSTRACT

A method, system and materials for use in hydrogen gettering in conjunction with microelectronic and microwave components that are generally hermetically sealed in an enclosure typically referred to as a "package". Gettering materials that can be used include titanium with or without a hydrogen permeable coating or covering, alloys of zirconium-vanadium iron and zeolites and several ways to apply these materials to the package. In addition, the hydrogen permeable material can be used over a vent from the interior of the package to the exterior wherein hydrogen will escape from the package interior when the hydrogen concentration within the package is greater than without the package.

15 Claims, No Drawings

HYDROGEN GETTERING SYSTEM

This application is a division of Ser. No. 08/946,212 filed Oct. 7, 1997, now U.S. Pat. No. 6,673,400, which claims priority under 35 U.S.C. 119(e)(1) based upon provisional application Ser. No. 60/028,541, filed Oct. 15, 1996.

BACKGROUND OF THE INVENTION

1. Field of the Invention

This invention relates to a method, system and materials for use in hydrogen gettering in conjunction with microelectronic and microwave components that are generally hermetically sealed in an enclosure typically referred to as a "package".

2. Brief Description of the Prior Art

The effect of molecular and atomic hydrogen is of particular concern for hermetically sealed microelectronic devices, generally those containing group III–V semiconductor materials and specifically gallium arsenide microwave integrated circuits. It is known that these devices degrade over time and temperature in the presence of even small amounts of molecular and atomic hydrogen. The amount of hydrogen which is tolerable depends upon the end use of the device and the required life expectancy thereof. In general, the presence of hydrogen in amounts of about 10 parts per million or less are tolerable but not easily obtainable. The mechanism under which this degradation occurs has been hypothesized by several sources, however there is no agreement at present as to the mechanism causing such degradation.

It is known that prior proposals to alleviate this problem have been made using organic hydrogen getter materials or inorganic getter materials in conjunction with an organic binder. The purpose of the getter is to capture as much as possible of the free gaseous hydrogen within the package interior, consequently decreasing or eliminating the rate of degradation of the hydrogen degradable material within the package, specifically gallium arsenide microwave integrated circuits and/or other hydrogen sensitive devices. The organic materials are generally unsatisfactory because they are: 1) limited in temperature range and/or 2) are reversible such that previously captured hydrogen may be released at elevated temperatures or with time and/or 3) because the getter rate decreases with time at temperature, ultimately limiting the temperature and/or length of time that the getter will function. It follows that other empirical approaches are required to minimize the above described problem.

SUMMARY OF THE INVENTION

In accordance with the present invention, the approaches taken to minimize the problem as discussed above involve the use of a getter of several different types and formed in several diverse manners.

One such getter involves the application of a transition metal, preferably nickel, palladium or platinum, using physical vapor deposition or electroplating. The deposited transition metal can be used in the pure metallic state or prepared as an oxide of the metal. In the pure form, transition metals such as platinum, palladium and nickel are known to absorb significant amounts of hydrogen without appreciable increase in the volume of the metal. In addition, the hydrogen can react with the pure metal to form hydrides and further getter the hydrogen. Also, the transition metals such as nickel, palladium and platinum can be oxidized to form a transition metal oxide through oxidation of the metal surface. In operation, the transition metal oxide reacts with hydrogen to form the elemental metal and water. A water getter can be included in the package to prevent accumulation of excessive levels of water vapor. The metal can be oxidized by a number of techniques, including thermal oxidation, plasma oxidation or chemical anodization. An alternate method of preparing the metal oxide is by direct sputter deposition of the metal oxide or by using reactive sputtering of the metal in an oxygen environment. The stoichiometry of the oxide is controlled to select the desired oxide type (e.g., PdO), such as, for example, through control of the reactive sputter deposition parameters.

The getter application location and/or size for both metal and metal oxide area are controlled by physical deposition masks, selective plating using plating masks or selective etching of the metal or metal oxide. Etching techniques include chemical or physical techniques. The getter is applied anywhere in the package interior and sized to assure any hydrogen within the package interior is completely captured. This approach has many advantages in that a very thin layer of metal or metal oxide can be formed, adding negligible weight or thickness to the package. Further, the described inorganic getters do not suffer from the temperature limitations of organic getters. In addition, a number of transition metals and/or metal oxides including those referenced above react with hydrogen over a wide temperature range and irreversibly getter hydrogen.

A specific approach to the problem is to utilize titanium as a housing or lid with or without a hydrogen permeable coating on the titanium. A desired hydrogen permeable coating is palladium which can be plated or vacuum deposited on top of the titanium. The purpose of the palladium is to prevent the titanium from oxidizing or otherwise being hydrogen getter inhibited. The titanium can also be used in bulk or sheet form as a discrete component which is adhesively or otherwise attached within the module. The surface area of the titanium can be substantially increased by forming a porous titanium structure, thus substantially increasing the rate of hydrogen gettering and decreasing the weight of the getter.

A second approach is to sputter, ion beam or otherwise vacuum coat a lid and/or housing with titanium to form a getter. The titanium can be overcoated in the vacuum deposition with a hydrogen permeable membrane such as palladium. This approach offers a very light weight getter with high surface area and excellent adhesion to metal oxides due to the high Gibbs free energy of oxide formation of titanium.

A third approach is to sputter deposit zirconium-vanadium-iron alloys with or without addition of one or more oxides of rare earth metals. These materials have shown hydrogen gettering characteristics in bulk form. The sputter deposited approach offers the unique advantages of light weight within a package, high surface area and good adhesion.

A fourth approach is to mix powders of titanium, palladium coated titanium or zirconium-vanadium-iron in an organic vehicle and screen print or otherwise dispense the material within a packaged module.

A fifth approach is to plate a hydrogen permeable but water impermeable membrane such as palladium onto a lid or other location in a module and etch or otherwise machine the support structure beneath the palladium to form a hydrogen permeable vent to the exterior of the package. This approach can also be incorporated into a hydrogen permeable plug or feedthrough that is soldered or welded to a housing or lid.

A sixth approach is to sputter deposit onto the interior surface of the package or module zirconium-vanadium-iron alloys with or without the additions of oxides of rare earth metals.

A further approach is to provide any hydrogen getter material including those named above which can be prepared in particulate or powder form. In application, the hydrogen and/or water getter material is ground or otherwise formed into a particulate or powder such that the particulate getter is mixed with an organic binder and screen printed on the desired surface. The binder is selected such that, upon screen printing and curing, the binder assures adhesive attachment of the getter to the desired surface and the binder allows permeability of the hydrogen or water through the binder and to the getter material. Typical binders that can be used include silicones, epoxies, acrylics, urethanes, polyimides and benzocyclobutene. A further benefit of this method of application is that the surface area of the getter in the mixed binder can be increased and controlled by varying the getter particulate size and thickness of the screen printed material. The screen printed method eliminates the need for forming the getter in bulk form, patterning or sizing it and adhesively attaching it within the hermetically sealed package in three separate operations. By the present technique, the hydrogen and or water getter is premixed with the binder and patterned, and adhesively attached in one operation, eliminating the separate, bulk material formation, sizing or patterning and adhesive attachment operations.

The screen printing method of getter attachment can also be extended to include an RF absorber material mixed with the hydrogen and/or water getter. The benefit of this method of application is that radio frequency absorber materials, including binders, commonly used today, release hydrogen in the curing process and after the curing process when installed in a package. By incorporating the hydrogen and/or water getter with the RF absorbing material in the presence of a binder, the additional absorber attachment process is eliminated. In addition, the getter is in intimate contact with the hydrogen releasing absorber material and will provide a more effective getter.

A still further method relates to the attachment of the getter to the interior of the microelectronic or microwave hermetically sealed enclosure using a numerically controlled placement and pump-dispensing system. Using this method, the inorganic getter is reduced to the desired particulate size and mixed with an epoxy or other organic binder and dispensed with precise thickness and dimensional placement control within the package interior. The RF absorber material can similarly be applied by itself or premixed with the hydrogen and/or water getter. Using this method of dispensing and application of the getter and/or radio frequency absorber, the pre-mixed material in paste form can also be used to attach components, eliminating multiple operations and combining component attachment, hydrogen getter attachment, water, getter attachment and radio frequency absorber attachment or any combination thereof in a single operation with resultant savings in assembly time and savings of physical space within the interior of the module.

DESCRIPTION OF THE PREFERRED EMBODIMENTS

In accordance with a first embodiment of the invention, a transition metal, preferably nickel, palladium or platinum, is applied to a package interior surface using sputtering, physical vapor deposition or electroplating. The deposited transition metal is deposited in the pure metallic state or prepared as an oxide of the metal. A gallium arsenide semiconductor device is then placed in the package interior and the package is hermetically sealed to provide the final device with hydrogen gettering activity. All of the steps are standard except for the additional step of providing the particular hydrogen getter. A water getter can be included in the package to prevent accumulation of excessive levels of water vapor, especially in the case where a metal oxide is reduced by the hydrogen to form elemental metal and water.

In accordance with a second embodiment of the invention, elemental titanium is used as a housing or package or as a lid for the housing or package with a hydrogen permeable coating on the titanium at the package hollow interior. The titanium can alternatively be used in bulk, sheet or porous form as a discrete component which is adhesively or otherwise attached within the package or module. The surface of the titanium over which a palladium layer is formed is preferably substantially oxide-free to provide improved hydrogen gettering activity by the titanium. The titanium can also be provided on the interior surface of a module by sputtering, ion beam or otherwise vacuum coating a lid and/or housing with titanium to form the getter. The titanium can again be overcoated in situ with a hydrogen permeable membrane such as palladium.

In accordance with a third embodiment of the invention zirconium-vanadium-iron alloys with or without addition of one or more oxides of rare earth metals are sputter deposited onto the interior surface of the package as above.

In accordance with a fourth embodiment of the invention, powders of titanium, palladium coated with titanium or zirconium-vanadium-iron are mixed in an organic vehicle, such as a silicone, epoxy, urethane, acrylic, polyimide or benzocyclobutene and screen printed or otherwise dispensed within a packaged module.

In accordance with a fifth embodiment of the invention, a hydrogen permeable membrane such as palladium is plated onto a lid or other location in a module and the support structure beneath the palladium is etched or otherwise removed to form a hydrogen permeable vent to the exterior of the package. This approach can also be incorporated into a hydrogen permeable plug or feedthrough that is soldered or welded into a housing or lid.

In accordance with a sixth embodiment of the invention, a bulk zeolite or zirconium-vanadium-iron having hydrogen gettering properties is applied by physical vapor deposition, chemical vapor deposition and/or adhesive attachment to the package interior by use of screen printing which precisely controls the location, thickness and dimensions of the coated area.

In accordance with a further embodiment, any hydrogen getter material including those named above which can be prepared in particulate or powder form is mixed with an organic binder of the type set forth above and screen printed or dispensed using a numerically controlled placement and pump dispensing system onto the desired surface.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of making a package containing a substantially hydrogen-free interior which comprises the steps of:
    (a) providing a hermetically sealed package having a hollow interior region;

(b) providing a hydrogen degradable semiconductor device material within said hollow interior;
(c) forming a hydrogen permeable layer onto a surface of said package;
(d) then forming a vent through said package from said hollow interior region to the exterior of said package through said layer to form a hydrogen permeable layer over said vent.

2. The method of claim 1 wherein said hydrogen permeable layer is a layer of palladium.

3. The method of claim 1 wherein said device is a gallium arsenide semiconductor.

4. The method of claim 2 wherein said device is a gallium arsenide semiconductor.

5. The method of claim 4 further including the step of placing said package in an environment where the concentration of hydrogen is less than the concentration of hydrogen in said hollow region.

6. The method of claim 1 wherein said hydrogen permeable layer is formed by plating.

7. The method of claim 1 wherein said step of forming a vent in said package is provided by etching said package.

8. The method of claim 2 wherein said hydrogen permeable layer is formed by plating.

9. The method of claim 2 wherein said step of forming a vent in said package is provided by etching said package.

10. The method of claim 3 wherein said hydrogen permeable layer is formed by plating.

11. The method of claim 3 wherein said step of forming a vent in said package is provided by etching said package.

12. The method of claim 4 wherein said hydrogen permeable layer is formed by plating.

13. The method of claim 4 wherein said step of forming a vent in said package is provided by etching said package.

14. The method of claim 5 wherein said hydrogen permeable layer is formed by plating.

15. The method of claim 5 wherein said step of forming a vent in said package is provided by etching said package.

* * * * *